(12) United States Patent
Pietsch et al.

(10) Patent No.: US 7,948,635 B2
(45) Date of Patent: May 24, 2011

(54) METHOD FOR DETERMINING POSITIONS OF STRUCTURES ON A SUBSTRATE

(75) Inventors: Katrin Pietsch, Solms (DE); Klaus-Dieter Adam, Jena (DE); Tillmann Ehrenberg, Schoeffengrund (DE)

(73) Assignee: Vistec Semiconductor Systems GmbH, Weilburg (DE)

(*) Notice: Subject to any disclaimer, the term of this patent is extended or adjusted under 35 U.S.C. 154(b) by 270 days.

(21) Appl. No.: 12/290,051

(22) Filed: Oct. 27, 2008

(65) Prior Publication Data

US 2009/0109443 A1    Apr. 30, 2009

(30) Foreign Application Priority Data

Oct. 25, 2007 (DE) .................. 10 2007 051 391

(51) Int. Cl.
  *G01B 11/02* (2006.01)
(52) U.S. Cl. ........................................ 356/500
(58) Field of Classification Search .................. 356/500
  See application file for complete search history.

(56) References Cited

U.S. PATENT DOCUMENTS

| | | | | |
|---|---|---|---|---|
| 5,550,633 A * | 8/1996 | Kamiya | ........................ | 356/500 |
| 6,347,458 B1 | 2/2002 | Kaczynski | ...................... | 33/503 |
| 6,377,870 B1 | 4/2002 | Blaesing-Bangert et al. | | 700/245 |
| 6,545,261 B1 * | 4/2003 | Blake et al. | ............... | 250/227.27 |
| 6,912,054 B2 * | 6/2005 | Hill | ............................... | 356/500 |
| 6,920,249 B2 | 7/2005 | Rinn et al. | ..................... | 382/199 |
| 6,960,755 B2 | 11/2005 | Kaczynski | ..................... | 250/221 |
| 7,265,823 B2 | 9/2007 | Kreh et al. | .................. | 356/237.4 |
| 7,751,060 B2 * | 7/2010 | Tanaka | ........................... | 356/500 |
| 2001/0006422 A1 * | 7/2001 | Fukagawa et al. | ............ | 356/500 |
| 2002/0159207 A1 | 10/2002 | Zimmerman et al. | ........... | 361/1 |
| 2005/0101036 A1 * | 5/2005 | Kreh et al. | ....................... | 438/14 |
| 2005/0254068 A1 | 11/2005 | Rinn et al. | ..................... | 356/625 |
| 2007/0103696 A1 | 5/2007 | Pohlmann | .................... | 356/498 |
| 2008/0291464 A1 * | 11/2008 | Sogard et al. | ................. | 356/500 |

FOREIGN PATENT DOCUMENTS

| | | |
|---|---|---|
| DE | 199 49 005 | 5/2001 |
| DE | 198 58 428 | 9/2002 |
| DE | 101 06 699 | 11/2003 |
| DE | 103 51 848 | 6/2005 |
| DE | 10 2004 023 739 | 12/2005 |
| DE | 100 47 211 | 3/2007 |
| DE | 10 2005 052 757 | 7/2007 |

OTHER PUBLICATIONS

Carola Blaesing:"Pattern Placement Metrology for Mask Making," presented by Dr. Carola Bläsing at the Semicon meeting, Education Program in Geneva, Switzerland on Mar. 31, 1998, 11 pages.

* cited by examiner

*Primary Examiner* — Michael A Lyons
(74) *Attorney, Agent, or Firm* — Davidson, Davidson & Kappel, LLC

(57) ABSTRACT

A system for determining positions of structures on a substrate is disclosed. The system includes a plurality of stations enclosed by a housing. At least one of the stations inside the housing is designed to be movable. The housing is provided with a filter fan unit generating an air flow in the housing. Air-directing elements are provided in the housing so that an invariable flow may be achieved irrespective of the at least one movable station.

9 Claims, 6 Drawing Sheets

Prior Art  Fig. 1

METHOD FOR DETERMINING POSITIONS OF STRUCTURES ON A SUBSTRATE

This claims the benefits of German Patent Application No. 10 2007 051 391.9, filed on Oct. 25, 2007, and hereby incorporated by reference herein.

The present invention relates to a system for determining positions of structures on a substrate.

BACKGROUND OF THE INVENTION

A coordinate measuring device is well-known from prior art. See, for example, the lecture script "Pattern Placement Metrology for Mask Making" by Dr. Carola Bläsing. The lecture was given on the occasion of the Semicon conference, Education Program, in Geneva on Mar. 31, 1998, and described the coordinate measuring machine in detail. The structure of a coordinate measuring machine as known, for example, from prior art will be explained in more detail in the following description associated with FIG. 1. A method and a measuring device for determining the position of structures on a substrate are known from German published application DE 100 47 211 A1. For details regarding the mentioned position determination, see that document.

Patent document DE 10 2005 052 757 B4 discloses a device for measuring the position of an object, including at least one laser interferometer system for determining a position displacement of the object in at least one spatial direction. The at least one laser interferometer system, together with the object, are accommodated in a climate chamber including an area with air intake apertures and an area with air exhaust apertures. Means are provided to direct at least part of the flow through the climate chamber to the area of the laser axes of the at least one interferometer system during operation.

German published application DE 199 49 005 A1 discloses means and a method for introducing various transparent substrates into a high-precision measuring device. The means is enclosed by a climate-controlled chamber. A magazine having several compartments in which substrate holders for various substrates are deposited is provided, for example, in the climate-controlled chamber. Furthermore, a loading station via which substrates may be introduced into the climate-controlled chamber is provided on at least one outer wall of the climate-controlled chamber. There is also provided an automatic transfer means in the climate-controlled chamber, which removes substrates from the magazine and transports them to the loading station or deposits them on the measurement table of the means.

A coordinate measuring machine is further known from a plurality of patent applications, such as DE 198 58 428 A1, DE 101 06 699 A1 or DE 10 2004 023 739 A1. All mentioned prior art documents disclose a coordinate measuring machine allowing the measurement of structures on a substrate. The substrate is deposited on a measurement table movable in the X-coordinate direction and in the Y-coordinate direction. The coordinate measuring machine is designed such that the positions of the structures and/or the edges of the structures are determined by means of an objective. In order to determine the position of the structures or their edges, the position of the measurement table needs to be determined by means of at least one interferometer. Finally, the position of the edge is determined with respect to a coordinate system of the coordinate measuring machine.

German patent application DE 103 51 848 A1 discloses a system for detecting macrodefects. The system is surrounded by a housing and is subdivided into a first segment, a second segment and a third segment. A stage displaceable in the X-direction and in the Y-direction, on which a wafer is placed, is provided in the second segment. An aspiration means is located in the first segment, which directs the aspirated air via an air guide into the second segment, wherein the air guide includes several air-directing panels so that an air flow is guided in parallel fashion over the wafer.

U.S. patent application no. US 2002/0159207 A1 discloses a ventilation system for lasers in industrial application. Several ventilators are provided in the housing of the laser to provide a corresponding air flow in the housing.

SUMMARY OF THE INVENTION

It is an object of the invention to provide a system allowing to provide a constant air flow within the housing, in which a plurality of movable and immobile stations are provided, irrespective of the movement of the movable stations.

The present invention provides a system including: a plurality of stations enclosed by a housing, wherein at least one of the stations inside the housing is designed to be movable; a filter fan unit provided with the housing, wherein the filter fan unit generates an air flow in the housing; and motor-adjustable air-directing elements are provided in the housing, which are adjustable depending on the position of the at least one movable station such that an invariable flow is ensured and wherein the air-directing elements are arranged in at least part of the air flow in the housing.

An air flow is generated in the housing by the filter fan unit. Since there may also be movable stations in the housing (measurement table, transport unit), the air flow may be disturbed due to the movement of the movable stations. In order to avoid this, adjustable air-directing elements are provided in the housing, which provide an invariable flow irrespective of the movement of the at least one movable station.

The movable station may be a measurement table movable in the X-coordinate direction and in the Y-coordinate direction and carrying the substrate. The station designed to be movable may also be a transport robot transporting the substrates to the various stations.

It is particularly advantageous if the air-directing elements are motor-adjustable air-directing plates which may be adjusted depending on the position of the at least one movable station such that the invariable flow is ensured. The air-directing plates are arranged in at least part of the flow in the housing. The air-directing element may further be designed as adjustable collar arranged around the measurement table. Depending on the position of the movable station (measurement table or transport robot), the collar may be adjusted such that an invariable flow is ensured.

For the adjustment of the air-directing plates, a database is provided from which the control values for the air-directing elements may be fetched as a function of the movement of the movable station. The database contains the flow conditions as they result when the movable station is moved to a particular place within the housing. Based on these data, the air-directing elements may thus be adjusted such that an invariable flow is ensured within the station irrespective of the movement of the movable stations.

At least one sensor preferably arranged in the area of the at least one movable station may also be provided in the system. This at least one sensor determines the flow conditions and generates control values for the air-directing elements therefrom. This ensures that there is an invariable flow at least at the movable station. The data regarding the flow conditions determined by the at least one sensor are forwarded to a computer which, based thereon, provides corresponding control values for actuators so that the air-directing elements are adjusted correspondingly to ensure an invariable flow within the housing.

The housing for the system may be designed as a climatic chamber and has at least one inflow opening in one area and at least one outflow opening in another area. The at least one inflow opening and/or the at least one outflow opening of the climatic room are sized and/or arranged such that at least part of the flow through the climatic room is a constant flow. It is to be noted that this constant flow may only be achieved if the movable stations are situated inside the housing of the climatic chamber.

As movable station, the system includes a measurement table, on which the substrate is located. The measurement table is arranged to be movable in the X-coordinate direction and in the Y-coordinate direction. For the determination of the position of the measurement table and thus also of the substrate, at least one laser interferometer is provided in one spatial direction. The at least one laser interferometer system, the substrate, the measurement table and at least one etalon are accommodated in the housing. Air-directing elements ensure that an invariable flow is directed to the laser interferometer systems and the etalon.

BRIEF DESCRIPTION OF THE DRAWINGS

In the following, embodiments will explain the invention and its advantages in more detail with reference to the accompanying drawings, in which.

DETAILED DESCRIPTION OF THE INVENTION

Figure 1:
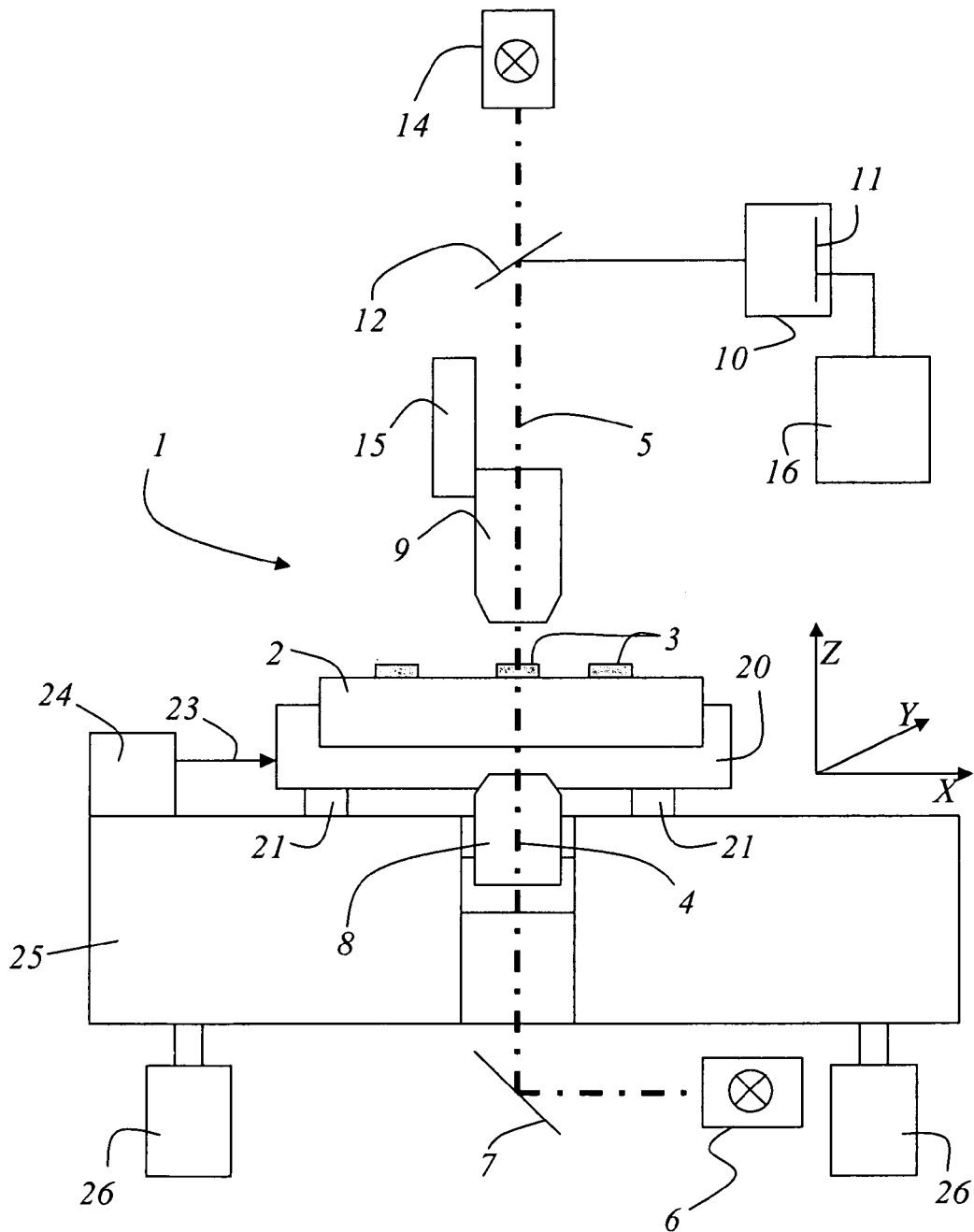
FIG. 1 schematically shows a coordinate measuring machine, which has been known from prior art for some time, with which the position of structures on a substrate may be measured.

A coordinate measuring device of the type shown in FIG. 1 has already been described in detail in prior art and is used for implementing the inventive method. The coordinate measuring device 1 includes a measurement table 20 movable in the X-coordinate direction and in the Y-coordinate direction. The measurement table 20 carries a substrate or a mask for the semiconductor production. Several structures 3 are applied to a surface of the substrate 2. The measurement table itself is supported by air bearings 21 which, in turn, are supported by a block 25. The air bearings described herein represent one possible embodiment and are not to be considered as limiting the invention. The block 25 may be made of a granite block. Someone skilled in the art will understand that the block 25 may consist of any material suitable for forming a plane 25a in which the measurement table 20 moves and/or is moved. At least one incident light illumination means 14 and/or one transmitted light illumination means 6 are provided for the illumination of the substrate 2. In the embodiment shown, the light of the transmitted light illumination means 6 is launched into the illumination axis 4 for the transmitted light by means of a deflecting mirror 7. The light of the illumination means 6 reaches the substrate 2 via a condenser 8. The light of the incident light illumination means 14 reaches the substrate 2 through the measurement objective 9. The light coming from the substrate 2 is collected by the measurement objective 9 and coupled out of the optical axis 5 by a semitransparent mirror 12. This measurement light reaches a camera 10 provided with a detector 11. The detector 11 has a computing unit 16 associated therewith, with which digital images may be generated from the acquired data.

The position of the measurement table 20 is measured and determined by means of a laser interferometer 24. For this purpose, the laser interferometer 24 emits a measurement light beam 23. Also, the measurement microscope 9 is connected to a displacing means 15 in the Z-coordinate direction so that the measurement objective 9 may be focused on the surface of the substrate 2. The position of the measurement objective 9 may, for example, be measured with a glass scale (not shown). The block 25 is further positioned on legs 26 with an anti-vibration arrangement. This vibration damping is supposed to maximally reduce or eliminate all potential building vibrations and natural vibrations of the coordinate measuring device.

Figure 2:
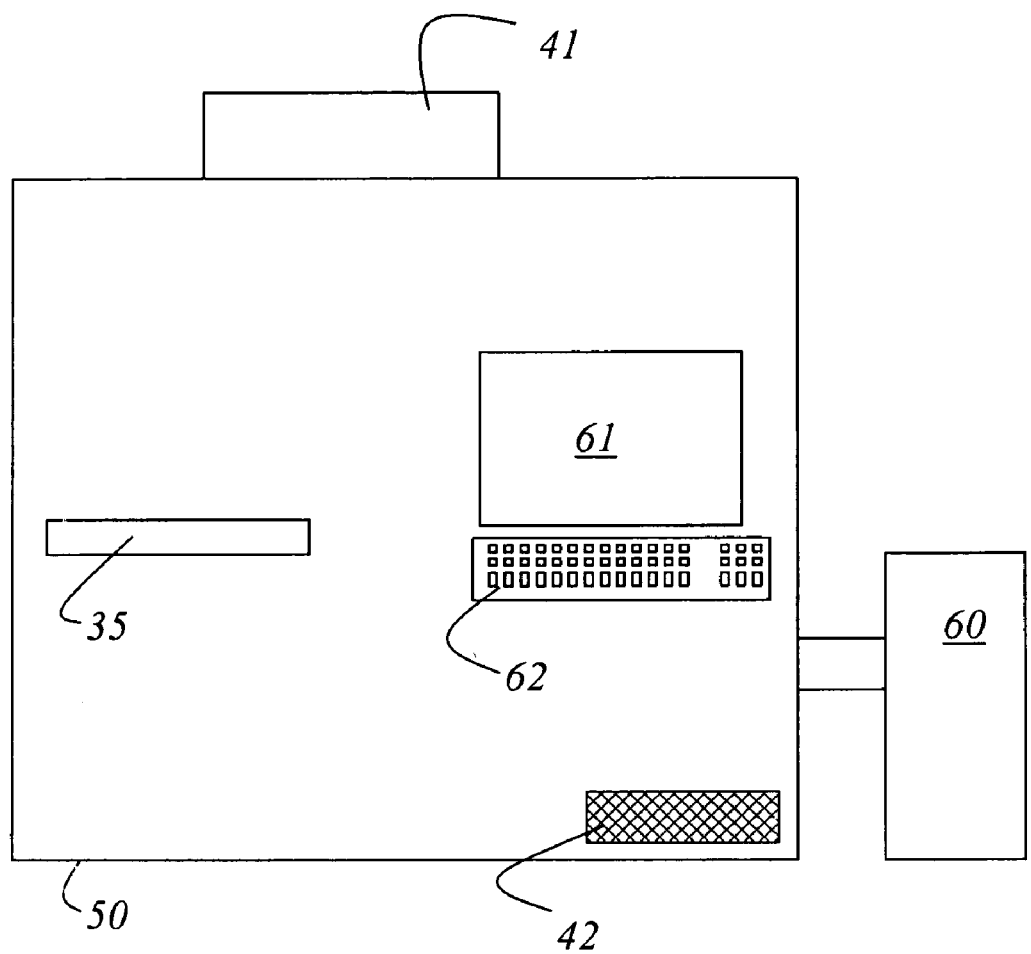
FIG. 2 schematically shows a housing enclosing the system and designed as climatic chamber provided with a filter fan unit.

FIG. 2 shows a schematic representation, wherein there is provided a housing 50 enclosing at least the coordinate measuring machine 1. In a preferred embodiment, the housing 50 may be designed as a climatic chamber. The housing 50 is provided with a filter fan unit 41 blowing air into the interior of the housing 50. Thus an air flow is generated inside the housing by this filter fan unit 41. At least one outflow opening 42 is provided in the housing for letting out the air flow blown in by the filter fan unit. The housing 50 also includes a transfer station 35 via which the substrates 2 to be examined may be transferred into the housing. The housing may further be provided with a display 61 having an input unit 62 (a keyboard in the present case) associated therewith. It is obvious for someone skilled in the art that the input unit 62 may be implemented in various ways. For example, the input unit 62 may be a track ball, a joystick or a touch screen. Via this input unit 62, the user may supply input to the coordinate measuring machine 1 and/or to the further systems and means for controlling the measurement method of a substrate 2 in the housing 50. The housing is further connected to a control and electronic unit 60 responsible for controlling and evaluating the data acquired by the coordinate measuring machine 1. It is advantageous to arrange this control and monitoring means 60 outside the housing 50 so that there is a minimum of sources producing waste heat in the housing 50.

Figure 3:
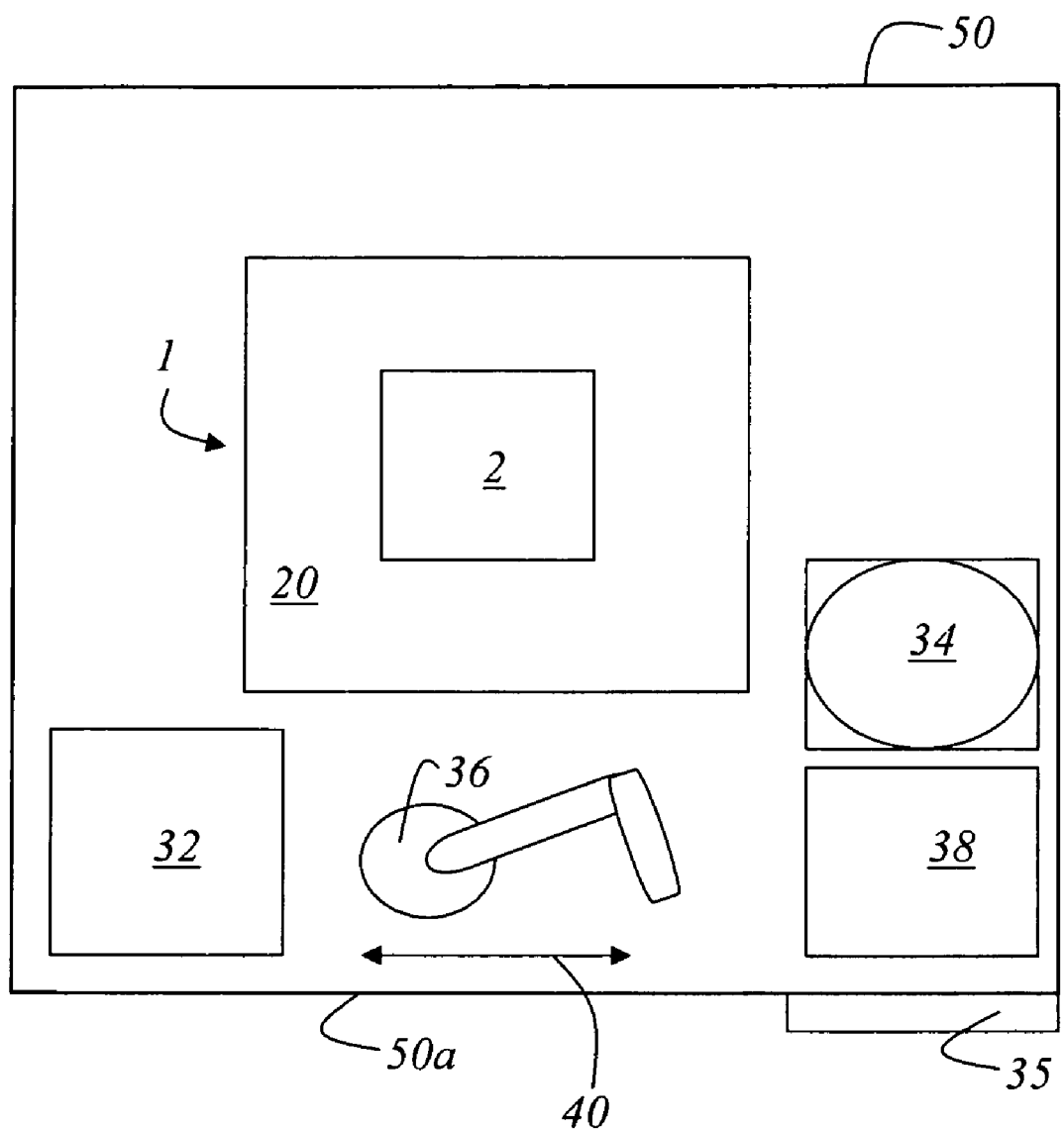
FIG. 3 shows a schematic view of the stations arranged inside the system.

FIG. 3 shows a schematic view of the arrangement of the coordinate measuring machine 1 and further means associated with the coordinate measuring machine 1 to ensure an efficient examination and/or measurement of the substrates 2. FIG. 3 shows a simplified coordinate measuring machine 1. In FIG. 3, the coordinate measuring machine 1 is represented only by the measurement table 20 and the substrate 2 located on the measurement table 20. The coordinate measuring machine 1 and other means are located in the housing 50 designed as climatic chamber. In the embodiment shown, a magazine 32 for storing substrates 2 or masks within the climatic chamber is associated with the coordinate measuring machine 1. Means 34 for orienting the substrates is also arranged in the climatic chamber. The transfer station 35 is provided in a wall 50a of the climatic chamber. A transport robot 36 and a further transport means 38 may also be provided in the climatic chamber. Although a magazine 32 for storing substrates 2 and/or temperature adaptation of substrates 2 is provided herein, someone skilled in the art will understand that the magazine in the climatic chamber may be omitted. The robot 36 may move along the direction indicated by the double arrow 40 within the climatic chamber. The substrates 2 may be transferred to the climatic chamber via the transfer opening 35. The transport means 38 represents a transfer station. The robot 36 removes the substrate 2 from the transfer station 38 and, depending on the recipe, places it onto the means 35 for orienting, the measurement table 20 or into the magazine 32.

Figure 4:
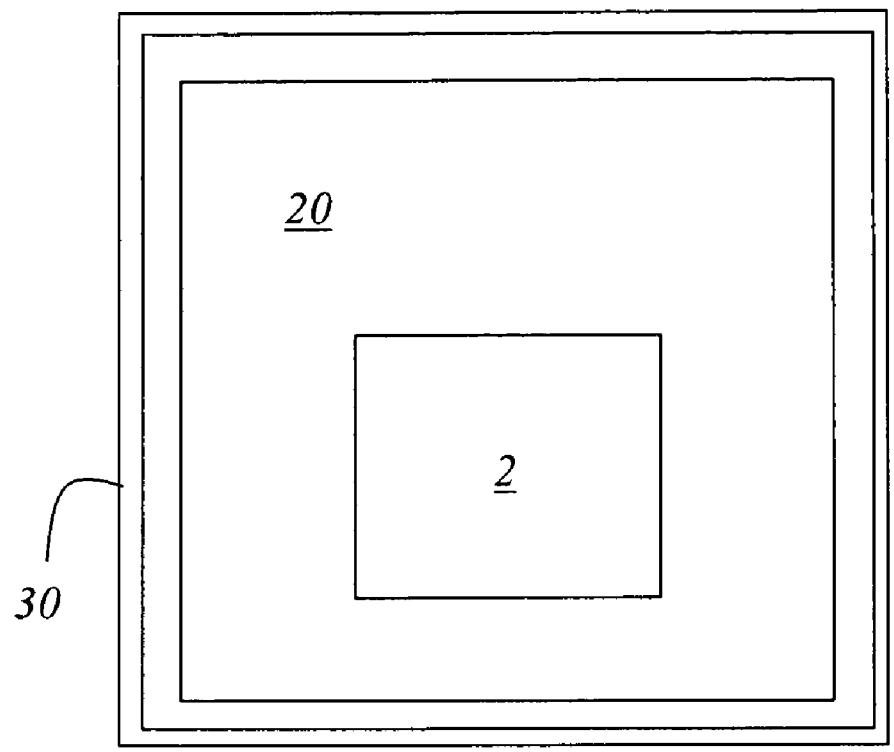
FIG. 4 schematically shows the view of the measurement table, which is provided with a movable collar for achieving a constant flow.

FIG. 4 shows a simplified representation of the measurement table 20 having a substrate 2 deposited thereon. The measurement table 20 is surrounded by a collar 30, which may be designed to be adjustable in the Z-coordinate direction. In this context, also see FIG. 5, which shows a side view of the measurement table 20. The measurement table 20 includes the collar 30, which is arranged to be displaceable along the double arrow 30a. As mentioned above, the measurement table 20 and/or the transport robot 36 are implemented as movable stations inside the housing 50. It is thus necessary to provide corresponding air-directing elements inside the housing, depending on the movement of these stations, so that there is a constant flow inside the housing 50 irrespective of the movement of the movable stations.

Figure 6:
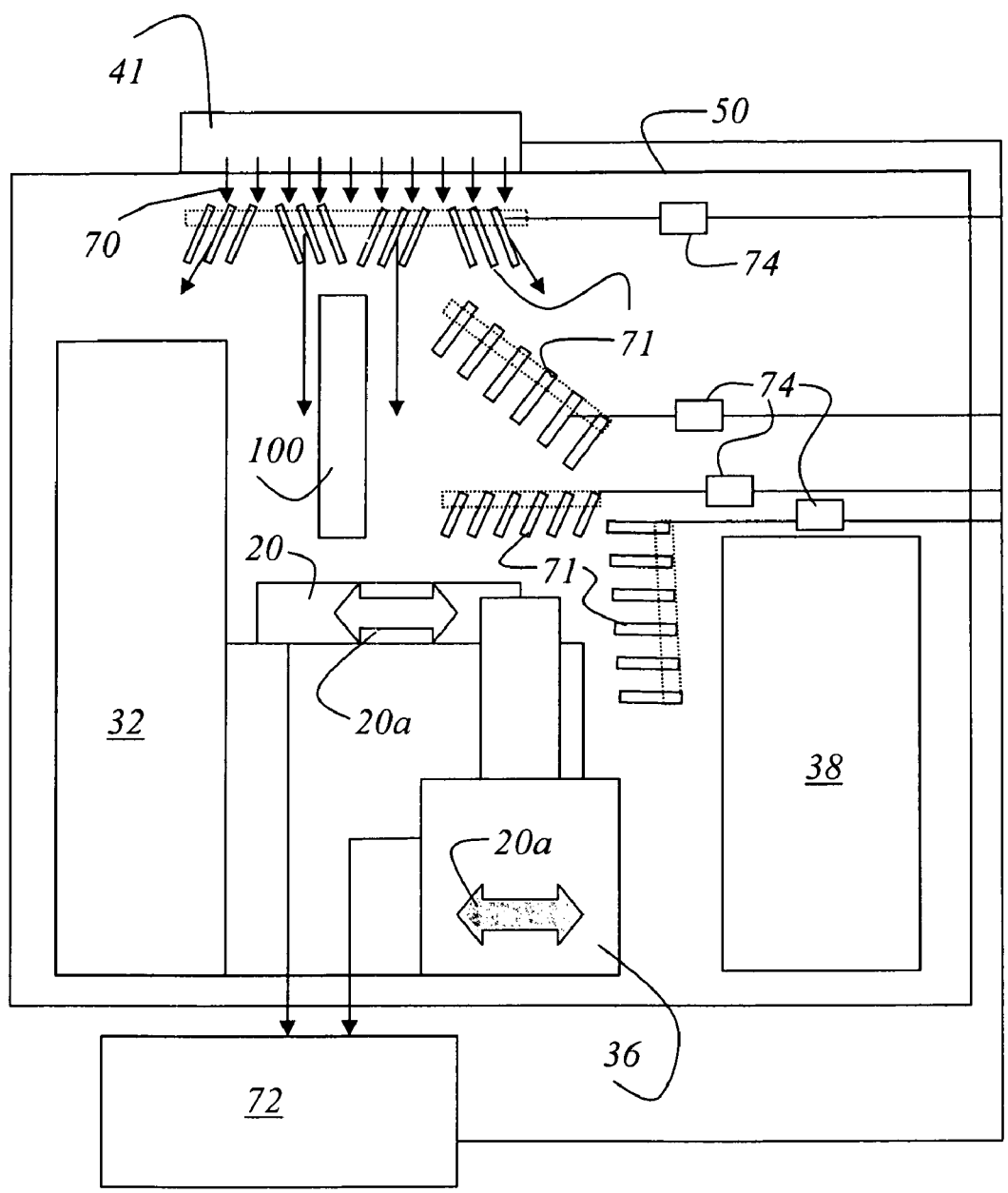
FIG. 6 shows a schematic arrangement of the air-directing elements, which may be adjusted by means of corresponding adjusting elements and based on the flow conditions stored in the database.
Figure 7:
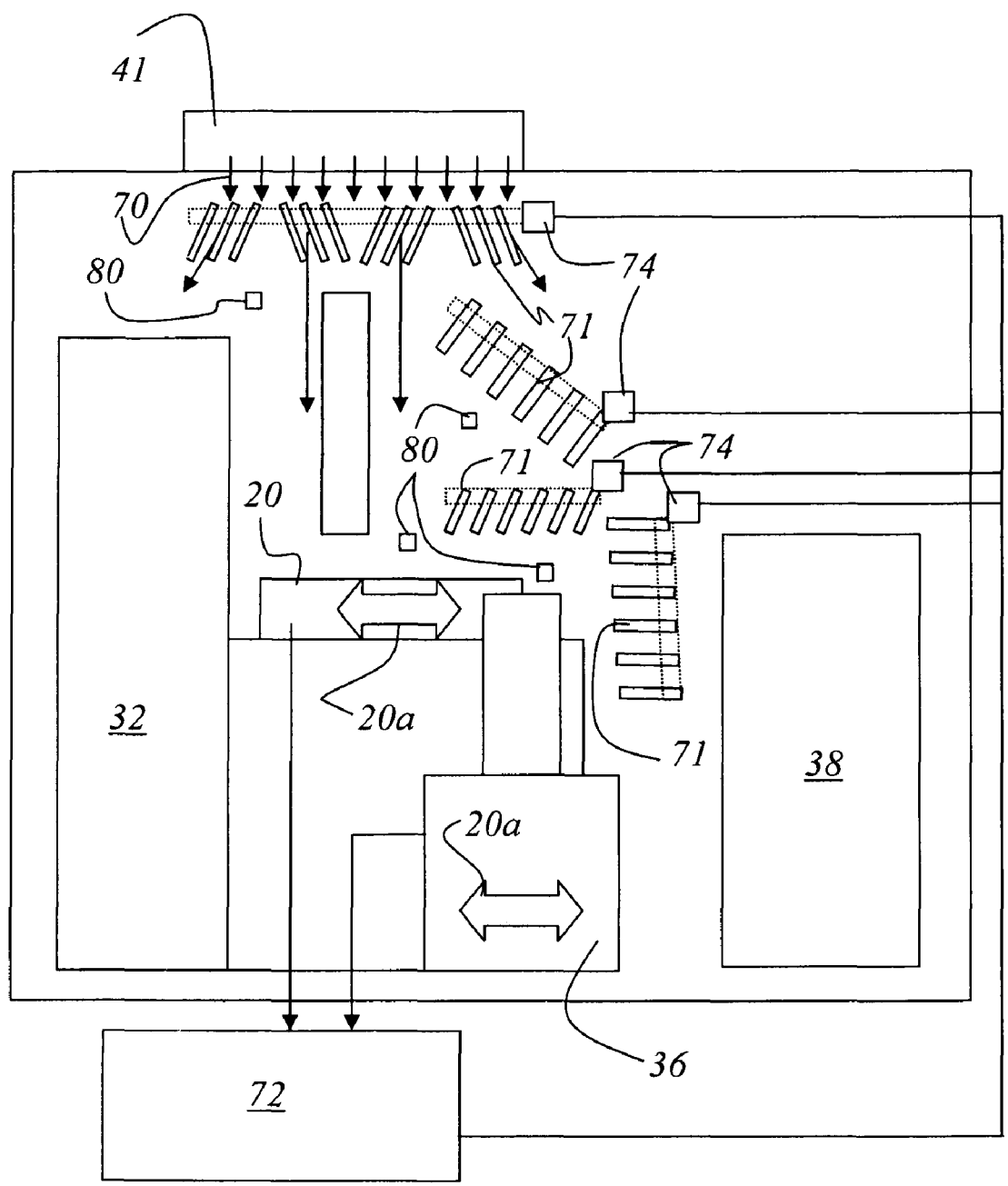
FIG. 7 shows another embodiment of the invention, wherein there are provided sensor elements constantly measuring the flow conditions inside the housing and thus adjusting the air-directing elements such that an invariable flow is achieved.

FIG. 6 shows a schematic embodiment of the system for measuring structures 3 on a substrate 2. As mentioned above, a plurality of stations 20, 32, 34, 35, 36 and 38 are arranged inside the housing 50. In the embodiment shown, the measurement table 20 and the transport robot 36 are implemented as movable stations. The measurement table 20 is movable so that the structure to be examined on the substrate may be moved into the optical path of the optical measuring means 100. The transport robot 36 is also designed to be movable to transport the substrates to be examined to the various stations 20, 32, 34, 35, 36 and 38. The movement of the movable stations 20 and 36 thus causes a change in the air flow within the housing 50. The air flow 70 is blown into the housing by means of the filter fan unit 41. Several air-directing elements 71 are provided in the housing 50 and/or in the air flow 70. These air-directing elements 71 allow directing the air flow 70 correspondingly to each of the stations 20, 32, 34, 35, 36 and 38. It is particularly important that there is a constant air flow in the area of the laser interferometers, which determine the position of the measurement table 20, and the etalons linked to the laser interferometers, so that the values measured by the laser interferometers are not affected by pressure fluctuations resulting from irregular air flows. In the embodiment shown in FIG. 6, the flow conditions are recorded as a function of the position of the movable stations 20 and 36. These flow conditions and/or the position of the air-directing elements 71 are stored in a database 72 as a function of the position of the movable stations 20 and 36. When a measurement is conducted, the air-directing elements 71 may be driven depending on the position of the movable stations 20 and 36 such that there is a constant flow. The control and/or change of the air-directing elements 71 is performed by corresponding motors 74 associated with the air-directing elements 71. In FIGS. 6 and 7, the movement of the movable stations 20 and 36 is indicated by a double arrow 20a.

Figure 5:
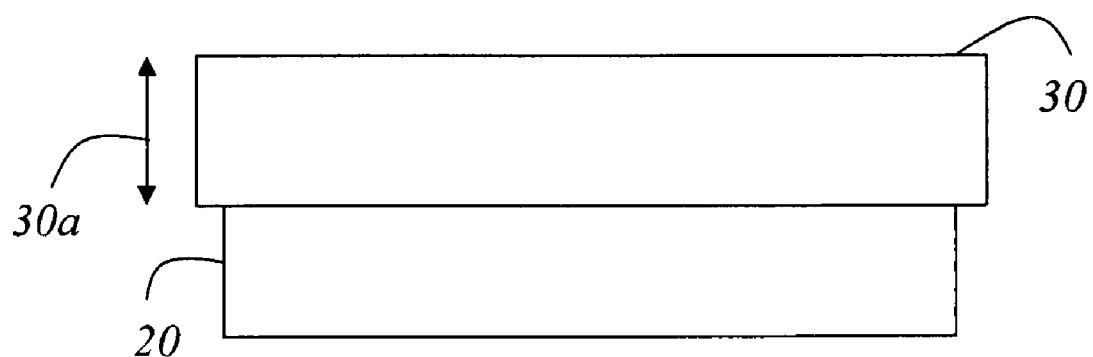
FIG. 5 shows a schematic side view of the measurement table partially surrounded by a movable collar.

FIG. 7 describes a further embodiment that allows providing a constant air flow inside the housing 50. Sensors 80 measuring the level of air flow at several stations inside the housing 50 are provided in the area of the movable stations 20 and 36 and/or in the area of stations sensitive to changes in the air flow 70. The data acquired by the sensors 80 are forwarded to a control and monitoring unit 75 and/or to a database 72. Based on these data, the air-directing elements 71 are controlled such that the sensors 80 measure an invariable flow. The position of the air-directing elements is also changed by motors 74. In a preferred embodiment, the air-directing elements 71 are implemented as so-called air-directing plates. Similarly, the collar 30 around the measurement table 20 mentioned in FIGS. 4 and 5 is implemented as a plate-like collar 30. The adjustment of this collar 30 is also performed by a motor.

The invention has been described with reference to particular embodiments. However, it is contemplated that modifications and changes may be made without departing from the scope of the following claims.

What is claimed is:

1. A system for determining positions of structures on a substrate, wherein the system comprising:
   a plurality of stations enclosed by a housing, wherein at least one of the stations inside the housing is designed to be movable;
   a filter fan unit provided with the housing, wherein the filter fan unit generates an air flow in the housing; and
   motor-adjustable air-directing elements provided in the housing, the air-directing elements being adjustable depending on a position of the at least one movable station such that an invariable flow is ensured and wherein the air-directing elements are arranged in at least part of the air flow in the housing.

2. The system of claim 1, wherein the movable station is a measurement table movable in a X-coordinate direction and in a Y-coordinate direction and carrying the substrate, and/or a transport robot, used to transport the substrates to the various stations.

3. The system of claim 1, wherein the air-directing elements are implemented as air-directing plates.

4. The system of claim 1, wherein the air-directing elements are implemented as an adjustable collar arranged around the movable station and adjustable depending on the position of the movable station such that the invariable flow is ensured.

5. The system of claim 1, wherein a database is provided from which control values for the air-directing elements are retrievable as a function of the movement of the movable station.

6. The system of claim 1, wherein there is provided at least one sensor which determines the flow conditions in the area of the at least one movable station and provides control values for the air-directing elements based thereon, so that an invariable flow is ensured at least at the movable station.

7. The system of claim 1, wherein the housing is a climatic chamber comprising an area with at least one inflow opening and an area with at least one outflow opening.

8. The system of claim 7, wherein the at least one inflow opening and/or the at least one outflow opening of the climatic chamber is sized and/or arranged such that at least part of the flow through the climatic chamber is a constant flow.

9. The system of claim 1, wherein the substrate is deposited on a measurement table movable in the X-coordinate direction and in the Y-coordinate direction, and further comprising at least one laser interferometer system in at least one spatial direction for determining a change in the position of the measurement table and thus of the substrate, wherein the at least one laser interferometer system, the substrate, the measurement table and at least one etalon are accommodated in the housing, and that the air-directing elements also direct an invariable flow to the laser interferometer systems and the etalon.

* * * * *